(12) United States Patent
Hisamoto et al.

(10) Patent No.: US 6,861,304 B2
(45) Date of Patent: Mar. 1, 2005

(54) SEMICONDUCTOR INTEGRATED CIRCUIT DEVICE AND METHOD OF MANUFACTURING THEREOF

(75) Inventors: Dai Hisamoto, Kodaira (JP); Tsuyoshi Kachi, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/357,227

(22) Filed: Feb. 4, 2003

(65) Prior Publication Data

US 2003/0137017 A1 Jul. 24, 2003

Related U.S. Application Data

(62) Division of application No. 09/702,653, filed on Nov. 1, 2000, now abandoned.

(30) Foreign Application Priority Data

Nov. 1, 1999 (JP) ............................................ 11-310982

(51) Int. Cl.⁷ .................... H01L 21/336; H01L 21/8234
(52) U.S. Cl. ...................... 438/197; 438/195; 438/199; 438/217; 438/301
(58) Field of Search ................................. 438/151, 153, 438/195, 196, 197, 199, 218, 219, 217, 301; 257/371

(56) References Cited

U.S. PATENT DOCUMENTS

| | | | |
|---|---|---|---|
| 5,250,818 A | 10/1993 | Saraswat et al. | ............... 257/66 |
| 5,726,459 A | 3/1998 | Hsu et al. | ...................... 257/55 |
| 6,127,216 A * | 10/2000 | Yu | .............................. 438/238 |
| 6,133,084 A * | 10/2000 | Chang et al. | ................ 438/238 |
| 6,190,952 B1 | 2/2001 | Xiang et al. | ................. 438/155 |
| 6,262,456 B1 | 7/2001 | Yu et al. | ...................... 257/371 |
| 6,281,559 B1 | 8/2001 | Yu et al. | ...................... 257/407 |
| 6,600,212 B2 * | 7/2003 | Takayanagi et al. | ......... 257/616 |
| 6,709,912 B1 * | 3/2004 | Ang et al. | ................... 438/199 |

FOREIGN PATENT DOCUMENTS

| | | |
|---|---|---|
| JP | 11-310982 | 11/1999 |
| JP | 2000-36593 | 2/2000 |

* cited by examiner

*Primary Examiner*—Maria F. Guerrero
(74) *Attorney, Agent, or Firm*—Antonelli, Terry, Stout & Kraus, LLP

(57) ABSTRACT

A semiconductor integrated circuit device wherein plural field effect transistors having different threshold values are integrated on one chip by forming plural gate electrodes of silicon-germanium mixed crystals having different germanium contents. By varying the germanium content of the gate electrode material, a work function with respect to the channel region can be varied, so a semiconductor integrated circuit device wherein plural field effect transistors having different threshold voltage values are integrated on one chip can be manufactured.

3 Claims, 13 Drawing Sheets

SEMICONDUCTOR INTEGRATED CIRCUIT DEVICE AND METHOD OF MANUFACTURING THEREOF This a division of application Ser. No. 09/702,653, filed Nov. 1, 2000 now abandoned, the entire disclosure of which is hereby incorporated by reference.

BACKGROUND OF THE INVENTION

1. Field of the Invention

This invention relates to a semiconductor integrated circuit device and a method of manufacturing the same.

2. Prior Art

In auxiliary type insulating gate type transistor circuits used in ULSI, which is currently a typical semiconductor integrated circuit device, due to the construction of the circuit or system, it is required to form insulating gate type transistor elements having different threshold voltages (Vth) on one silicon semiconductor substrate or semiconductor chip. In the prior art, to vary the threshold values of these transistors, the dependence of the threshold values on impurity concentration was mainly used. For example, in a gradual channel approximation, the threshold value (Vth) may be expressed as a parameter of the impurity concentration (Na) forming a channel, i.e., $$Vth = \Phi ms + 2\Phi_F + (2\epsilon_s \cdot \epsilon_0 \cdot q \cdot Na \cdot (Vbs + 2\Phi_F))^{1/2} \cdot Cox^{-1} \quad [\text{Eqn. 1}]$$

Herein, $\Phi$ ms is a work function difference between the gate electrode material and silicon channel, $\Phi_F$ is the silicon channel Fermi level, $\epsilon_s$, $\epsilon_0$ are, respectively, the relative dielectric constant of silicon and the dielectric constant of a vacuum, q is the charge on the electron, Vbs is a source-substrate bias, and Cox is a gate insulating film capacity.

Using the ion implantation method, semiconductor regions of different impurity concentrations (depending on which elements they are used for) are formed on the same chip. Hence, it is possible to integrate elements having threshold values of different capacities, which is one of the features of LSI using MIS transistors.

However, now that elements are becoming more detailed, the problem of leak current has arisen due to short channel effects, as typified by punch through between source and drain. To suppress this leak current, the impurity concentration of the substrate must be increased to create a potential blocking layer, but this starts to conflict with the substrate impurity concentration calculated from Eqn. 1 for setting the threshold value. In other words, there is a severe restriction on the setting of the substrate impurity concentration to satisfy the dual objects of punch through and desired threshold voltage value (Vth).

Further, in the low power consumption, high speed large-scale semiconductor integrated circuit devices which are expected to be developed in the future, the Inventor considered that a new technique would be necessary to control transistor threshold voltage values (Vth) precisely to an order of approximately 0.1V (with a scatter within about ±10 mV), in view of the fact that the source voltage Vdd to operate these devices will be 1V or less.

The Inventor noted a serious problem in that when a Silicon-On-Insulator (Sol) substrate is used, which is effective in suppressing short channel effects, as the silicon layer forming the channel is extremely thin, it was very difficult to vary the threshold value (Vth) by controlling the impurity amount in this part.

SUMMARY OF THE INVENTION

One object of the invention is to provide a new semiconductor integrated circuit device which can precisely implement the threshold values (Vth) of these transistors to an order of approximately 0.1V, to provide a semiconductor element construction of such a device, and also a method of manufacturing the device.

As shown in Eqn. 1, the threshold value depends not only on the impurity concentration forming the channel, but also on the work function of the gate electrode material. The Inventor therefore focused on the fact that, by forming a gate electrode using materials having different work functions, it was possible to deposit insulating gate type transistors having different threshold values on the same chip or substrate without being subject to the aforesaid impurity concentration restriction. As a result of various experiments, an integrated circuit device was manufactured wherein the threshold value Vth was precisely controlled to a precision of the order of 0.1V by forming an integrated circuit with plural insulating gate type transistors, using a silicon-germanium (Si—Ge) mixed crystal having different Ge composition ratios as gate electrode material. It was found that to manufacture the device, it was desirable to maintain the characteristics of the gate insulating film, which is an important element of these transistors, by interposing a Si layer, effectively not containing germanium and of a very low thickness (of such a thinness that the effect of the work function of the Si—Ge mixed crystal gate electrode on Vth is not much decreased), between these Si—Ge mixed crystal gate electrodes and the gate insulating film. An integrated circuit device wherein the interconnection resistance of the gate electrode part was reduced was also manufactured by depositing a metal layer such as Ti (titanium), TiN (titanium nitride), WN (tungsten nitride), TiSi (titanium silicide), W (tungsten) or Wsi (tungsten silicide) on an upper surface of the Si—Ge mixed crystal gate electrode.

The foregoing and other objects, advantages, manner of operation, and novel features of the present invention will be understood from the following detailed description when read in connection with the accompanying drawings.

DETAILED DESCRIPTION OF THE INVENTION

This invention will be described in more detail with reference to the appended drawings.

Figure 1:
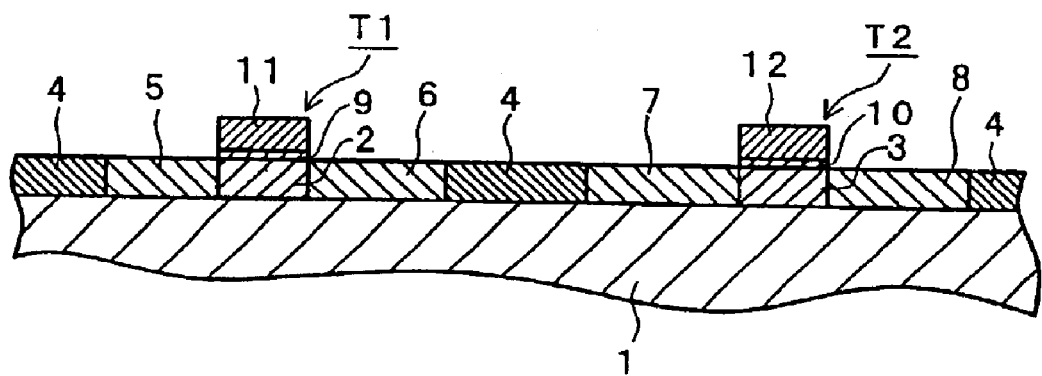
FIG. 1 is a cross-sectional view of a semiconductor integrated circuit device according to the first embodiment of the invention.

FIG. 1 shows a cross-section of the essential parts of a semiconductor integrated circuit device having an SOI construction according to the invention. As this invention is mainly concerned with the construction method of manufacturing the gate electrode, in FIG. 1, the interconnection layer is omitted and the element structure is simplified. Numerals 2 and 3 are P type silicon semiconductor regions formed on the main surface of an insulator 1, numeral 4 is an isolating region comprising SiO$_2$ formed by selectively oxidizing these silicon semiconductor regions so as to surround an element forming part, numeral 5, 6, 7, and 8 are plural N type semiconductor regions formed by selectively introducing N type determining impurities into this silicon semiconductor region from its main surface to the insulator 1 underneath, numerals 9 and 10 are gate electrode films comprising SiO$_2$ respectively formed on the main surfaces of the P type semiconductor regions 2 and 3, and numerals 11 and 12 are gate electrodes comprising Si—Ge mixed crystals into which boron, which is a P type determining impurity, has been doped (introduced) to a high concentration (e.g., $10^{20}$ cm$^{-3}$), respectively formed on the gate electrode films 9 and 10. The gate electrodes of 11 and 12 have different Ge contents, and a transistor T1 formed from 2, 5, 6, 9, and 11, and a transistor T2 formed from 3, 7, 8, 10, and 12, have different threshold voltage values (Vth) due to the difference of Ge content in the gate electrode.

This polycrystalline Si—Ge has a different work function depending on its composition ratio, and is disclosed for example in IEEE Transactions on Electron Devices, Vol. 41, No. 2, February 1994, p. 228, published by Tsu-Jae King, et al.

This reference proposes applying this structure to a P channel thin film transistor, but no mention whatsoever is made of its application to an N channel element or to plural transistors having different threshold values.

The Inventor found, for the first time, that it is possible to manufacture an integrated circuit device comprising plural transistors having different threshold values comprising a semiconductor integrated circuit device with an N channel MISFET using an SOI substrate.

In the integrated semiconductor device according to the invention, the threshold value of each transistor depends on the work function of the gate electrodes 11 and 12, respectively, in contact with the gate electrode films 9 and 10. For example, in prototypes manufactured by the Inventor, wherein the Ge composition ratio of the gate electrode 11 was 50% (mol %) and the Ge composition of ratio of the gate electrode 12 having effectively the same thickness was 20% (mol %), the mixed crystal composition ratios (i.e., Ge contents) of the gate electrodes 11 and 12 are different. Hence, an integrated circuit device could be manufactured wherein plural transistors having threshold values differing by 0.2V within a scattering precision of ±10 mV were formed on one substrate, although the substrate impurity concentration, which in this embodiment is the impurity concentration of the P type semiconductor regions 2 and 3, is identical.

Further, to improve the characteristics of the integrated circuit device, the Inventor made various improvements to the construction of the N channel type insulating gate field effect transistor.

Figure 2:
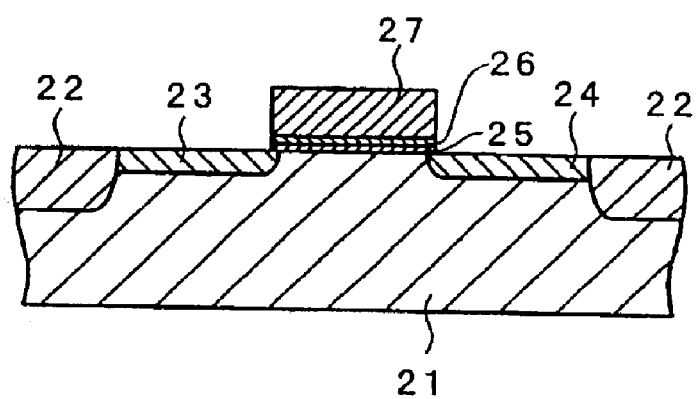
FIG. 2 is a cross-view of one semiconductor element used in the invention.

FIG. 2 shows a cross-section of the essential parts of this improved transistor. An isolating region 22 comprising SiO$_2$ is provided on the main surface of a P type Si substrate 21, a gate insulating film 25 comprising SiO$_2$ is provided on a part of the surface of the substrate 21, and a gate electrode 27 comprising a Si—Ge mixed crystal, in which P type impurities are doped to a high concentration, is provided on the upper part. A thin Si layer 26 effectively not containing Ge is provided between this gate electrode and the aforesaid gate insulating film. This Si layer should also be doped with P type impurities to a high concentration. Numerals 23 and 24 are N type semiconductor regions formed by introducing an N type determining impurity into the main surface of the substrate 21 not covered by the gate electrode 27, and, respectively, they form source and drain regions. The aforesaid Si layer 26 is thinner than the gate electrode 27, and it is desirable that its thinness is such that the effect of the work function of the gate electrode 27 on the threshold value of the transistor is effectively not lost. Specifically, the thickness of the Si layer 26 is as thin as approximately 1/10 or less than the thickness of the Si—Ge electrode 27 when the thickness of the gate electrode 27 is approximately 20 to 100 nm. For example, the thickness of the Si layer 26 is approximately 2 to 8 nm. This Si layer 26 which effectively does not contain Ge, is effective in improving the adhesion of the Si—Ge mixed crystal layer to the gate electrode film. Further, as the thin, clean gate electrode film 25 underneath is vertically sandwiched between Si, which has good compatibility, the gate electrodes of 25 are protected from an abnormal mechanical stress such as the thermal stress, etc., and the electrical characteristics of the transistor can be stably maintained. In particular, to form an IC having gate electrodes of different component compositions, as shown in FIG. 1, it is desirable that the electrical characteristics except for Vth are uniform or effectively identical in the transistors T1 and T2. In other words, the work function of the gate electrode material on top can be used effectively while maintaining the adjoining state at the interface of Si and $SiO_2$.

Figure 3:
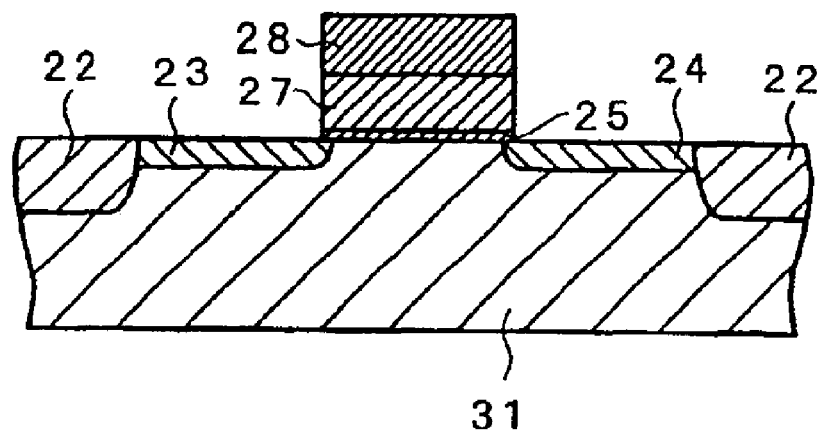
FIG. 3 is a cross-sectional view of another semiconductor element used in the invention.

FIG. 3 shows a cross-section of the essential parts of another improved transistor construction. To simplify the description, identical parts are referred to by the same symbols (hereafter idem). In the figure, a metal layer 28 such as Ti, TiN, WN, TiSi, W, or Wsi is deposited on an upper surface of the gate electrode of the Si—Ge mixed crystal, and this is effective in reducing the interconnection resistance in a semiconductor integrated circuit device in which high frequency operation is required, as shown in FIG. 1.

Figure 4:
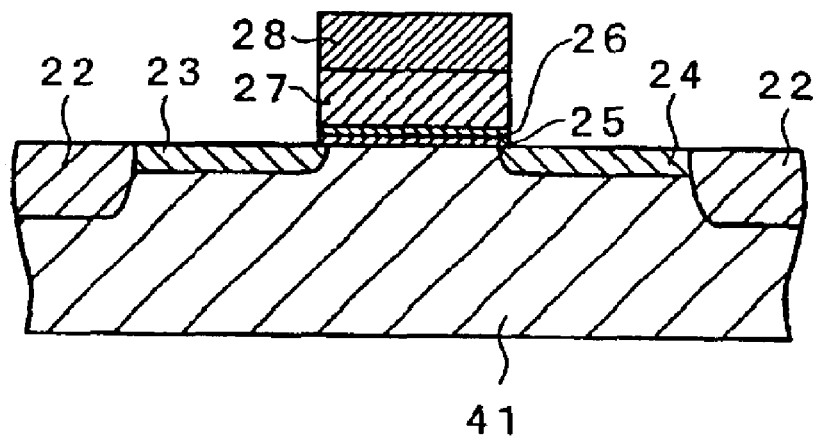
FIG. 4 is a cross-sectional view of yet another semiconductor element used in the invention.

FIG. 4 is a diagram showing a cross-section of the essential parts of another improved transistor construction, wherein the features of FIG. 2 and FIG. 3 are combined. The thin Si film 26 effectively not containing Ge, into which P type impurities have been doped, is provided between the Si—Ge gate electrode 27, into which P type impurities have been doped, and the gate insulating film 25. The metal film 28, i.e., Ti, TiN, WN, TiSi, W, or Wsi is deposited on the Si—Ge gate electrode 27. In this way, the LSI shown in FIG. 1, which is capable of high speed operation and has stable characteristics, can be manufactured.

Hereafter, an example of a method of manufacturing the semiconductor integrated circuit device according to this invention will be described using FIG. 5 to FIG. 13, which show cross-sectional views of the essential parts of the element construction.

Figure 5:
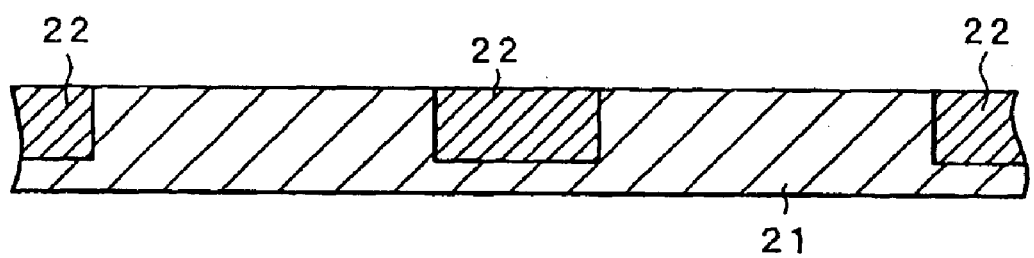
FIG. 5 is a cross-sectional view describing a step in the manufacture of the semiconductor integrated circuit device according to the invention.

First, a groove with a depth of approximately 0.4 µm is formed as a groove surrounding an active region (i.e., the element-forming region) of the main surface of the P-type silicon substrate 21, as shown in FIG. 5, and the isolation layer 22 comprising $SiO_2$ is formed by filling this groove with a $SiO_2$ film. This step is known as STI (Shallow Trench Isolation).

Figure 6:
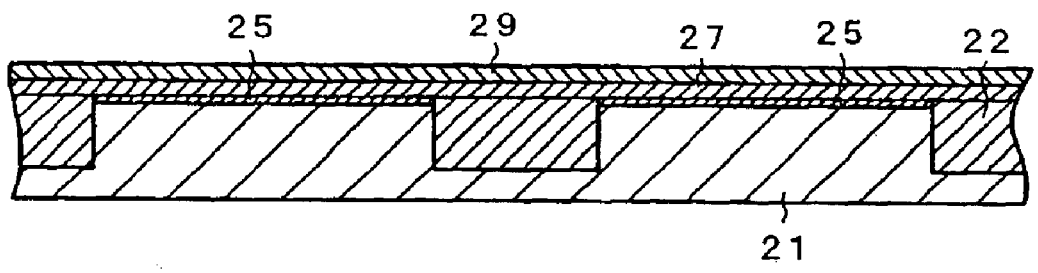
FIG. 6 is a cross-sectional view describing a step in the manufacture of the semiconductor integrated circuit device according to the invention.

Next, the gate $SiO_2$ film 25 of a thickness of approximately 3 nm is formed by oxidative heating of the exposed active region surface in nitrogen gas at approximately 800° C., as shown in FIG. 6, and the gate electrode layer 27 comprising Si—Ge mixed crystals is deposited by CVD (Chemical Vapor Deposition) using a gas containing a Si compound, a Ge compound, and a conducting type-determining impurity source. Specifically, the Si—Ge gate electrode layer 27 was formed by depositing silicon germanium mixed crystals, which had been doped to a high concentration with boron, to a thickness of 30 nm on the aforesaid gate $SiO_2$ film by CVD using $SiH_4$, $GeH_4$, and $B_2H_6$ as raw material gases at approximately 400° C. for approximately one hour. The composition ratio of germanium in this process was a arranged to be 50% (mol %) by adjusting the component composition and flow-rate of these gases. Further, a Si layer 29 doped to high concentration with boron and effectively not containing germanium was deposited to a thickness of approximately 10 nm on this gate electrode layer 27. This process can be performed simply using the same CVD apparatus by stopping the supply of $GeH_4$ gas following the aforesaid CVD step. For example, these semiconductor layers may be polycrystallized by heating an amorphous semiconductor layer deposited by ordinary CVD.

Figure 7:
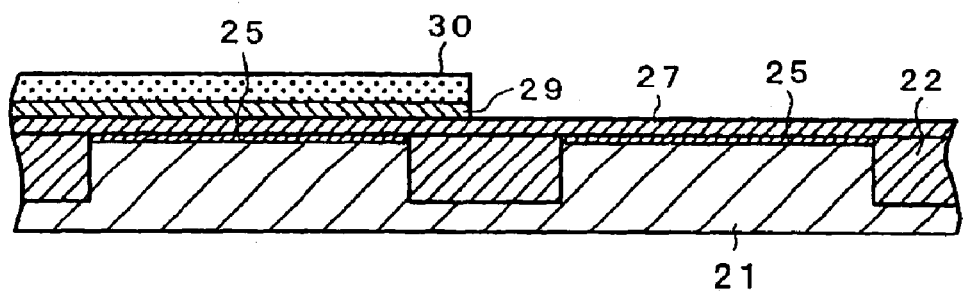
FIG. 7 is a cross-sectional view describing a step in the manufacture of the semiconductor integrated circuit device according to the invention.

Next, the poly Si layer 29 on a second transistor forming part was removed by etching, by patterning using ordinary photoetching, covering the upper part of one transistor (e.g., the first transistor) by a photoresist film 30 as shown in FIG. 7. In this process, the Si—Ge gate electrode layer 27 is allowed to remain so that the surface of the gate insulating film 25 underneath is not exposed.

Figure 8:
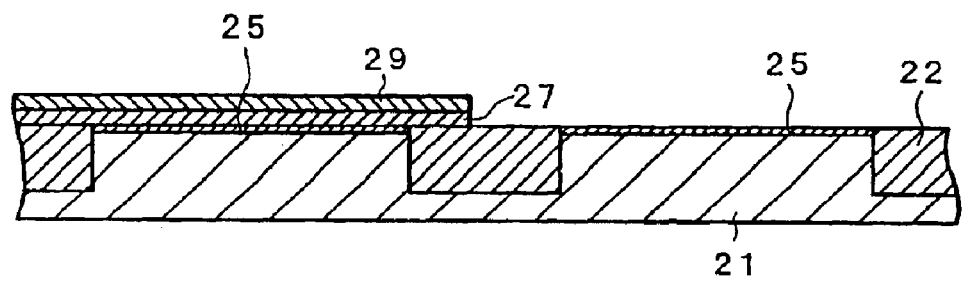
FIG. 8 is a cross-sectional view describing a step in the manufacture of the semiconductor integrated circuit device according to the invention.

Next, as shown in FIG. 8, after removing the photoresist 30, the exposed Si—Ge gate electrode layer 27 is removed by etching using the remaining poly Si layer 29 as a mask, using aqueous hydrogen peroxide and ammonia. For this purpose, it was immersed for approximately 5 to 10 minutes in an etching solution comprising H2O2:NH4OH:H2O= 2:1:5, heated to approximately 60–70° C. As the silicon oxide film 25 and polysilicon layer 29 are not etched by this etching solution, the Si—Ge layer 27 on the second transistor forming part can be completely removed leaving the gate insulating film 25. Instead of the above etching solution, an etching solution comprising hydrofluoric acid, aqueous hydrogen peroxide, and acetic acid in the ratio HF:H2O2:CH3COOH1=1:2:3 can also be used.

Figure 9:
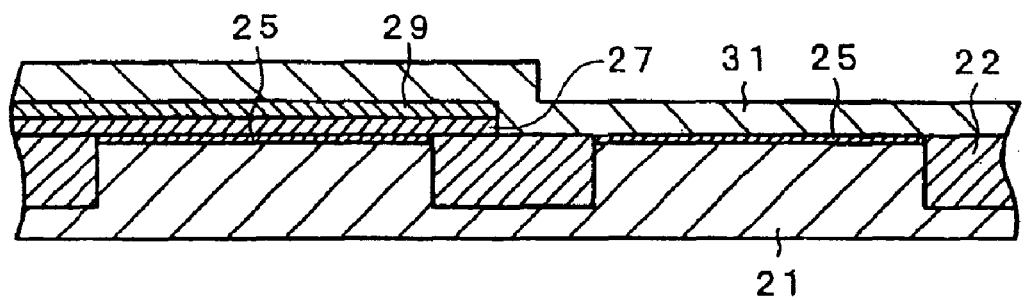
FIG. 9 is a cross-sectional view describing a step in the 5 manufacture of the semiconductor integrated circuit device according to the invention.

Next, mixed crystals of silicon-germanium, wherein the composition ratio was changed to 20% (mol %), were deposited to a thickness of approximately 50 nm on a gate electrode layer 31, as shown in FIG. 9. In this example, this is done by a CVD technique identical to that described in FIG. 6, and as the gate electrode layers 27 and 31 and the poly Si layer 29 are all P type conducting layers doped to high concentration with a P conducting type impurity (e.g., doped with boron to $10^{20}$ $cm^{-3}$), there is no problem regarding conductivity even if they are laminated.

Figure 10:
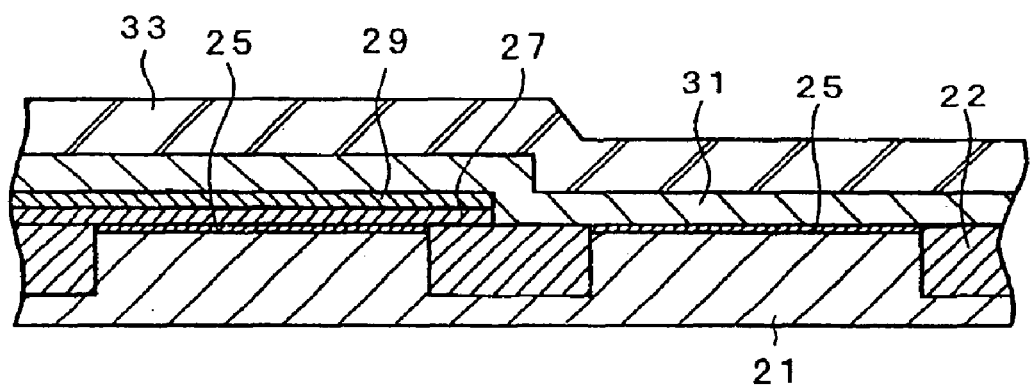
FIG. 10 is a cross-sectional view describing a step in the manufacture of the semiconductor integrated circuit device of the invention.
Figure 11:
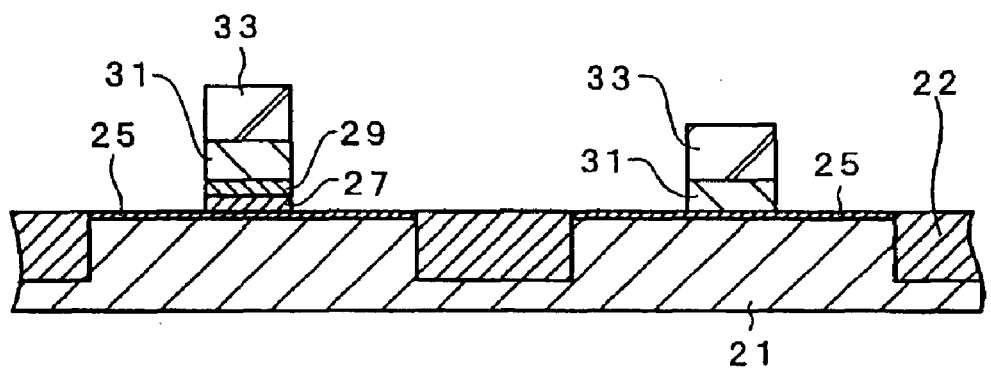
FIG. 11 is a cross-sectional view describing a step in the manufacture of the semiconductor integrated circuit device of the invention.

Next, a silicon oxide film 33 is deposited by ordinary CVD on this gate electrode layer 31, as shown in FIG. 10.

Next, photoetching is performed on the silicon oxide film 33 to pattern the gate electrode layers 27 and 31, and the gate electrode layers are patterned by ordinary dry etching using the remaining $SiO_2$ film 33 as a mask. As Si and Si—Ge mixed crystals substantially have the same etching rate in this dry etching, various types of laminated gate electrodes can be simultaneously patterned, thereby forming the gate electrodes 27 and 31.

Figure 12:
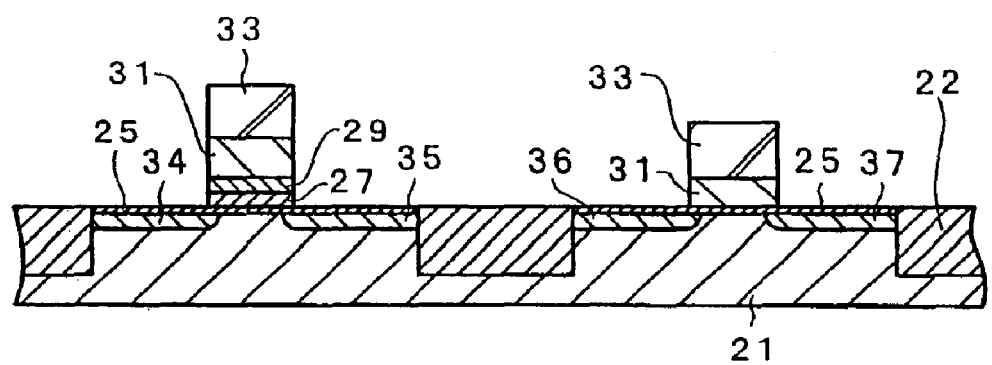
FIG. 12 is a cross-sectional view describing a step in the manufacture of the semiconductor integrated circuit device of the invention.

Next, arsenic is doped to $2 \times 10^5$ $cm^{-2}$ at an acceleration voltage of 20 keV by ion implantation using these patterned gate electrodes 27 and 31 as shown in FIG. 12 to form the N type semiconductor regions 34, 35, 36 and 37 in the substrate surface. At this time, a P type semiconductor region, not shown, which functions as a punch through stopper is formed by ion implantation of boron using the same mask before or after implanting arsenic. The impurity concentration in the outer periphery region of the channel forming region of the main surface of the P type semiconductor region can be increased, and the depletion layer extending into the channel forming part can be suppressed when a voltage is applied between the sources 34 and 36 and the drains 35 and 37.

Figure 13:
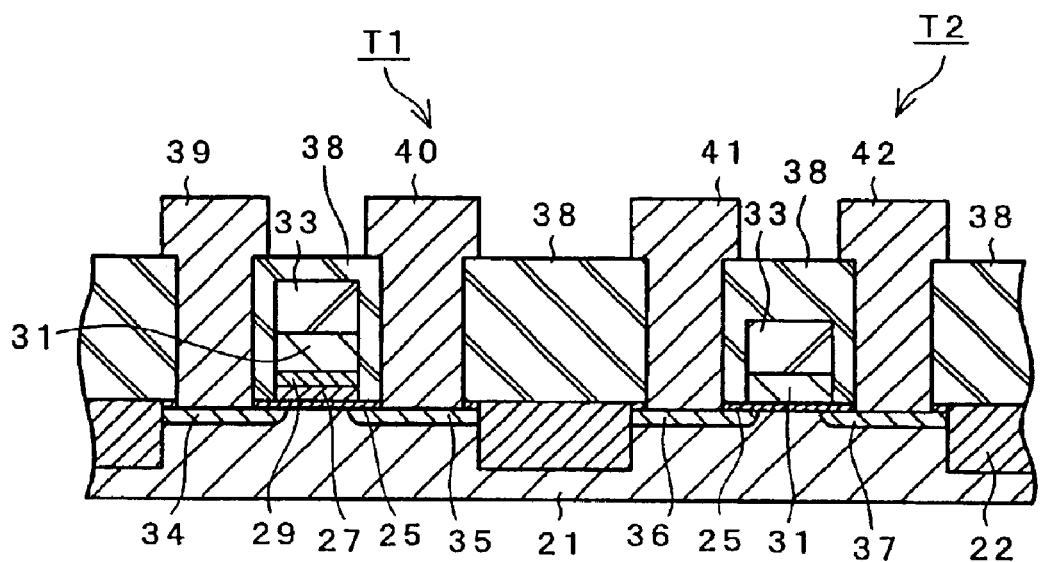
FIG. 13 is a cross-sectional view describing a step in the manufacture of the semiconductor integrated circuit device of the invention.

Next, as shown in FIG. 13, an insulating film layer 38 comprising $SiO_2$ is deposited, the device surface is flattened, a contact hole is opened to expose the surface of diffusion layers 34, 35, 36 and 37 and the gate electrode part 31, and the interconnections 39, 40, 41 and 42 (the contacts with the gate electrodes are not shown) are formed by a metal such as tungsten.

Therefore, a semiconductor integrated circuit device can be produced by integrating plural N channel insulating gate type transistors having different Vth on one Si substrate by the Si—Ge mixed crystal gate electrodes 27 and 31 having a different Ge content. Hence, according to this embodiment of the invention, a semiconductor integrated circuit device can be manufactured having plural, different threshold values and having a desired circuit action even if there are plural insulating gate type transistors of the same conducting type, e.g., N channel type MISFET.

In the above example, the case was described where there were two different threshold values, but a semiconductor integrated circuit device comprising plural MISFET having three or more different threshold values can be obtained by repeating a step to selectively remove the mixed crystal electrode layer 27 of the unnecessary part using the silicon layer 29 as a mask after laminating the Si—Ge mixed crystal gate electrode layer 27 and silicon layer 29.

Next, the method of manufacturing a semiconductor device of yet another embodiment according to this invention will be described.

Figure 14:
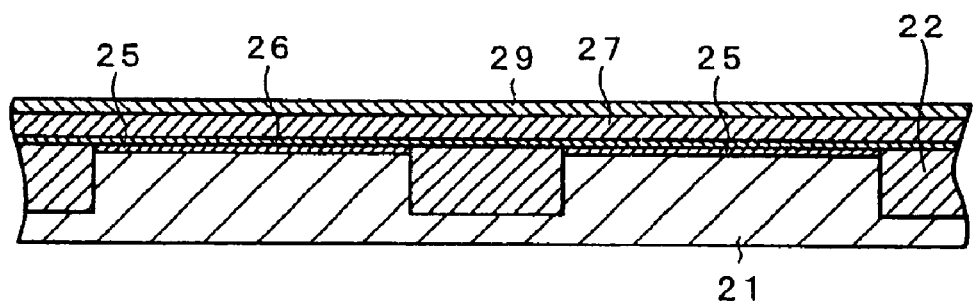
FIG. 14 is a cross-sectional view describing a step in the manufacture of the semiconductor integrated circuit device of the invention.
Figure 15:
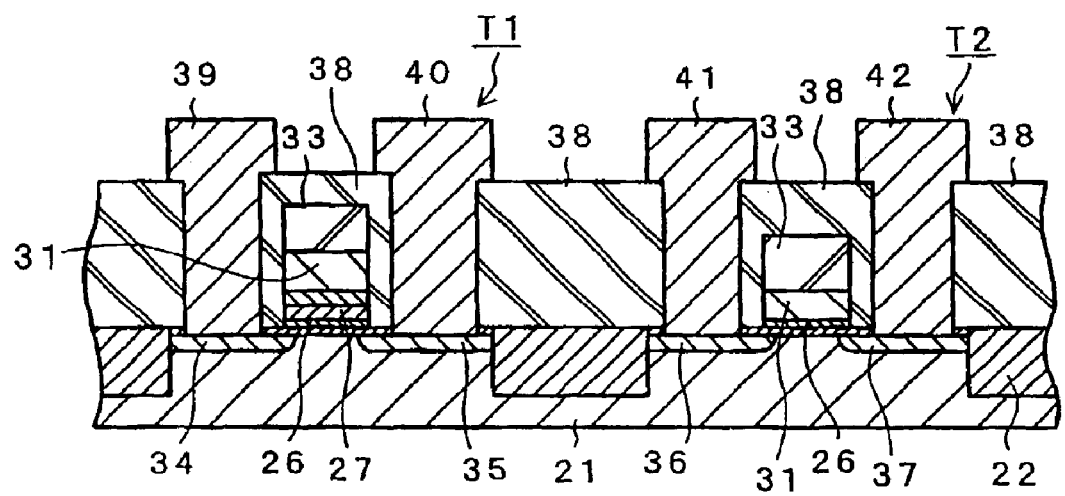
FIG. 15 is a cross-sectional view describing another step in the manufacture of the semiconductor integrated circuit device of the invention.

FIG. 14 shows the case where, in the step of the aforesaid FIG. 6, the Si—Ge gate electrode layer 27 is not deposited directly on the gate insulating film 25, but the thin polysilicon film layer 26, effectively not containing germanium and in which P type impurities have been doped, is deposited between them as described in FIG. 2. This P type polysilicon layer 26, effectively not containing germanium, can be formed to an extreme thinness of the order of approximately 2 to 8 nm on all the gate insulating films by stopping the supply of Ge $H_4$ gas for a predetermined short time prior to depositing the Si—Ge gate electrode layer 27 using the CVD method described in the step of FIG. 6. By so doing, there is a manufacturing advantage in that the Si layer 26 functions as an etching stopper before selectively removing the Si—Ge electrode layer 27 by etching using the Si layer 29 as a mask, as described in the step of FIG. 8, thereby completely preventing the exposure of the gate oxide film 25. FIG. 15 is a cross-sectional view of the essential parts of a finished semiconductor integrated circuit device obtained by subjecting the product formed in this way to the steps of FIG. 7 to FIG. 12, and an integrated circuit device comprising plural N channel type transistors of different Vth due to the Si—Ge gate electrodes 27 and 31 having different compositions can thus be formed on one substrate.

Figure 16:
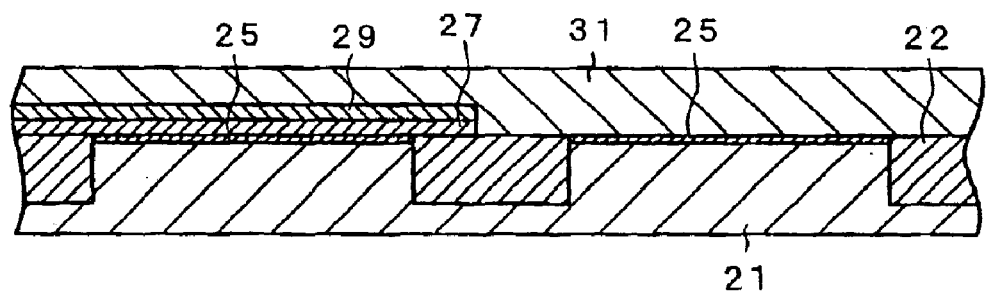
FIG. 16 is a cross-sectional view describing another step in the manufacture of the semiconductor integrated circuit device of the invention.

Another embodiment is shown in FIG. 16. In this case, the second Si—Ge mixed crystal gate electrode layer 31 is deposited partially thick in places in the step of FIG. 9, and the upper surface of this Si—Ge mixed crystal gate electrode layer 31 is then flattened by ordinary CMP (Chemical Mechanical Polishing). In this way, the patterning of subsequent steps, for example, the patterning of the gate electrodes, is made easy.

Figure 17:
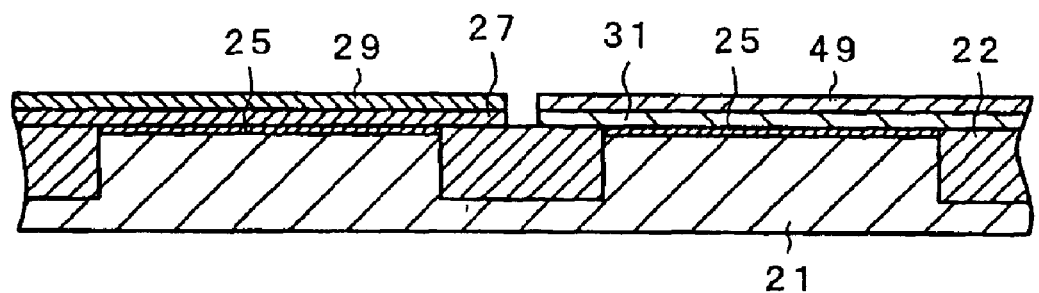
FIG. 17 is a cross-sectional view describing another step 5 in the manufacture of the semiconductor integrated circuit device of the invention.

FIG. 17 is obtained by depositing a P type polysilicon layer 49 not containing germanium onto the Si—Ge gate electrode layer 31 obtained in the step of FIG. 9, covering it by a $SiO_2$ film or photoresist film only on one side (the right-hand side in the diagram), and then partially removing the Si—Ge gate electrode layer 31 by etching. This eliminates the breakdown of flattening due to excessive gate lamination.

Figure 18:
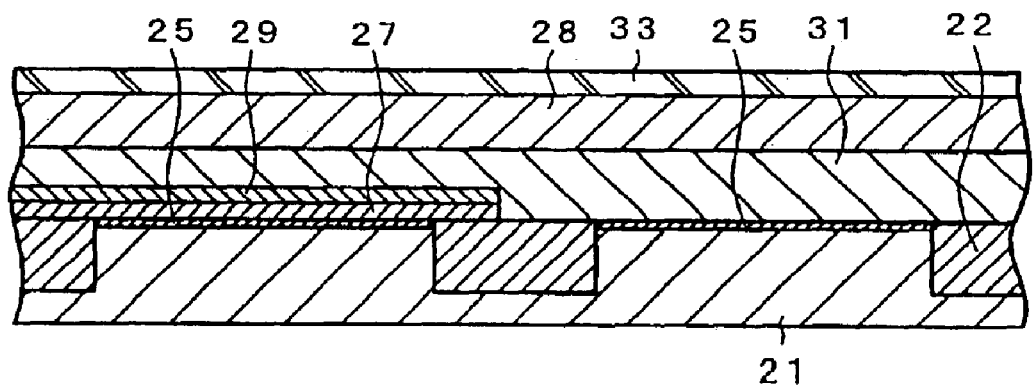
FIG. 18 is a cross-sectional view describing another step in the manufacture of the semiconductor integrated circuit device of the invention.

FIG. 18 is obtained by depositing the metal layer 28, e.g., Ti, TiN, WN, TiSi, W, or WSi, on the gate electrode layer 31 obtained in the steps of FIG. 9 or FIG. 16, and the resistance of the gate electrode of the circuit element which is obtained as described in FIG. 3, can therefore be reduced.

Figure 19:
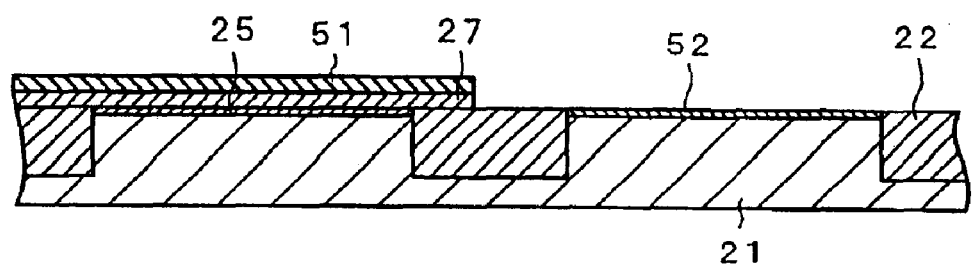
FIG. 19 is a cross-sectional view describing another step in the manufacture of the semiconductor integrated circuit device of the invention.
Figure 20:
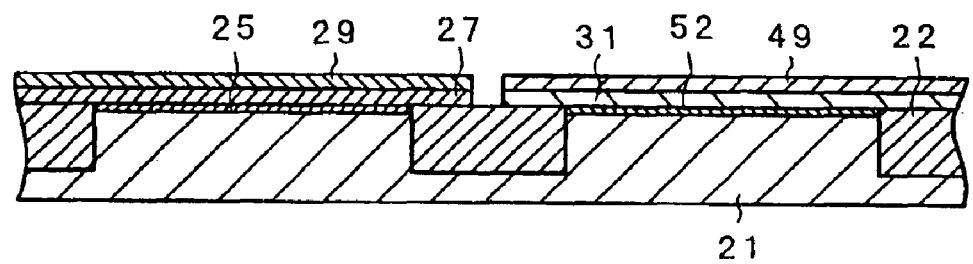
FIG. 20 is a cross-sectional view describing another step in the manufacture of the semiconductor integrated circuit device of the invention.

A silicon nitride film 51 can, for example, be deposited on the gate electrode layer 27 instead of the polysilicon layer 29 in the step of FIG. 6, as shown in FIG. 19. In FIG. 8, the case was described where the gate insulating film 25 was left as it is, but in this example, the gate insulating film 25 of the second element forming part is also removed by etching, and the exposed Si substrate surface is reoxidised, leaving the silicon nitride film 51. A new gate insulating film ($SiO_2$) 52 having a different film thickness than the first element forming part can thus be formed in this second element forming part. Subsequently, the silicon nitride film 51 is removed, the Si—Ge gate electrode layer 31 and Si layer 49 are formed as shown in FIG. 20, or the gate electrode layer 31 is deposited in the various steps of FIG. 9 and subsequent figures. In this way, the semiconductor integrated circuit device shown in FIG. 13 or 15 can be manufactured.

In integrated semiconductor devices, referred to as LSI, due to the construction of the circuit or system, it is required to form MOSFETs having various threshold voltage (Vth) values.

Figure 24:
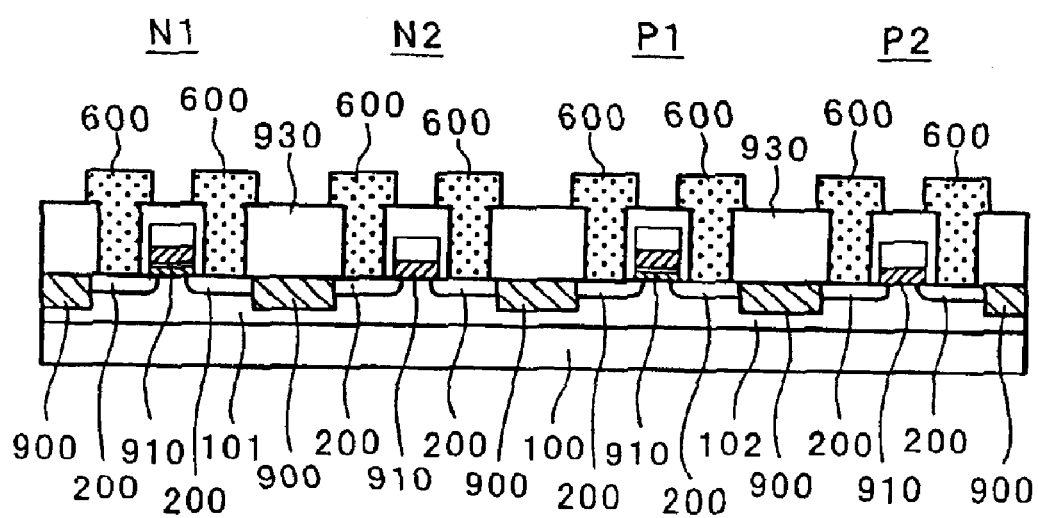
FIG. 24 is a cross-sectional view describing yet another semiconductor integrated circuit device according to the invention.

Although hereinabove examples of two transistors are explained in detail, in order to show the realization of the plurality of threshold voltage (Vth) values, further elements can be integrated as shown in FIG. 24, according to the present invention.

In FIG. 24, circuit elements having four kinds of different threshold voltage (Vth) values are integrated on one semiconductor substrate or semiconductor chip by using Si—Ge mixed crystal having two different kinds of composition and forming two N-MOSFETs and two P-MOSFETs respectively therein.

In the figure, 101 shows a P-well and 102 shows a N-well. This invention is especially useful to the integration of many elements like this. Namely, in FIG. 24, a first N-MOS (N1) and a first P-MOS (P1) are formed in the first Si—Ge mixed crystal with the same composition, and a second N-MOS (N2) and a second P-MOS (P2) are formed in the second Si—Ge mixed crystal with the same composition, wherein the threshold voltage of N1 and N2 can be substantially equal to the threshold voltage of P1 and P2. For example, by using Si—Ge with a Ge concentration of 20 mol % and 40%, their threshold voltage of 0.15V can be obtained.

Hereinabove to show the capability to fabricate the elements with a different composition by laminating, a so-called single gate type MOSIC wherein only P type gates are integrated is for the most part explained. However, according to the present invention SiGe mixed crystal gates can become conductive by using the same impurity as poly-Si gates, and so-called dual gate MOSICs comprising a P-type gate and an N-type gate can be obtained. For example, a P-type gate can be fabricated by forming an N-type gate by partially doping phosphorus with a high concentration of no less than $10^{20}$ cm$^{-3}$ by ion-implantation, and by forming a P-type gate by doping boron therein in the same way. This proper use of implantation can be carried out without any relation with the proper use of fabricating gates having different composition.

Furthermore, in the structure having no laminated portion, as shown in FIG. 17, referred to as in-situ doping of the respective N type impurity and P type impurity can be used by flowing the impurity gas ($B_2H_6$ and $PH_3$) at the same time as the deposition of SiGe mixed crystal. Thereby, impurity can be doped with high accuracy. In dual gates the polycrystalline Si has a work function of about 1.1 V corresponding to the band gap of Si. On the other hand, the work function of SiGe mixed crystal in the N type gate is substantially the same as the polycrystalline Si, but in the P type gate the work function can be changed by the composition, and, therefore, a special gate having a wide region of work function of 0.5 to 1.1 V can be obtained between the N type gate and the P type gate.

As said before, it becomes difficult to control the setting of the threshold voltage by doping impurity. However, the situation of the threshold voltage depending on impurity concentration is the same in scaling. Therefore, by further changing impurity concentration and adding the work function, a threshold voltage controlled to a precise fine value can be obtained by this invention.

Hereabove, various manufacturing methods relating to the invention were described. By using an ordinary CVD apparatus used to form Si—Ge mixed crystal gate electrode layers, and by adjusting the composition, flowrate processing time, and temperature, various silicon or Si—Ge films and layers can be formed relatively simply, so a semiconductor integrated circuit device can be manufactured by a process which is roughly equivalent to that for an ordinary LSI.

Figure 21:
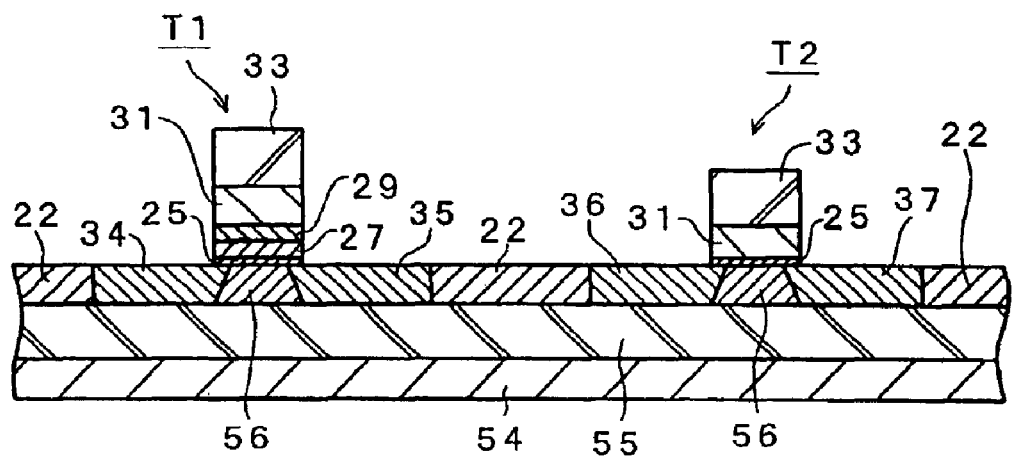
FIG. 21 is a cross-sectional view describing another semiconductor integrated circuit device according to the invention.

FIG. 21 shows a cross-sectional view of the essential parts of a semiconductor integrated circuit device relating to the invention formed on the substrate surface of a silicon on insulator ("SOI") using the manufacturing process of this invention. For example, a high resistance P type silicon layer 56 is used which is doped by P type impurities such as boron, to the extent of about $10^{16}$ cm$^{-3}$, formed on an "insulating substrate" comprising, for example, the substrate 54 of a semiconductor such as glass, metal, or Si, and an insulator 55 such as the $SiO_2$ embedded above. Hence, an insulating gate type transistor, having plural threshold values comprising a transistor Ti formed by the Si—Ge gate electrode 27 having a first composition and a transistor T2 formed by the Si—Ge gate electrode 31 having a second composition, is formed by laminating on the upper part of one insulator.

In this figure, the isolation region 22 and the plural N type semiconductor regions 34, 35, 36, and 37 comprising sources and drains are formed with a depth reaching the insulator 55 underneath. In general, in MOS transistors using an SOI substrate, the fact that the silicon layer which is the channel has a thin film thickness, and the fact that the impurity concentration cannot be increased to enhance the element performance are large obstacles in determining the threshold values, but according to this invention, the threshold voltage value on the gate electrode side can be changed, regardless of the impurity concentration of the substrate or element forming semiconductor region, and this is extremely useful in thin film SOI-MOSFET (TFT).

Figure 22:
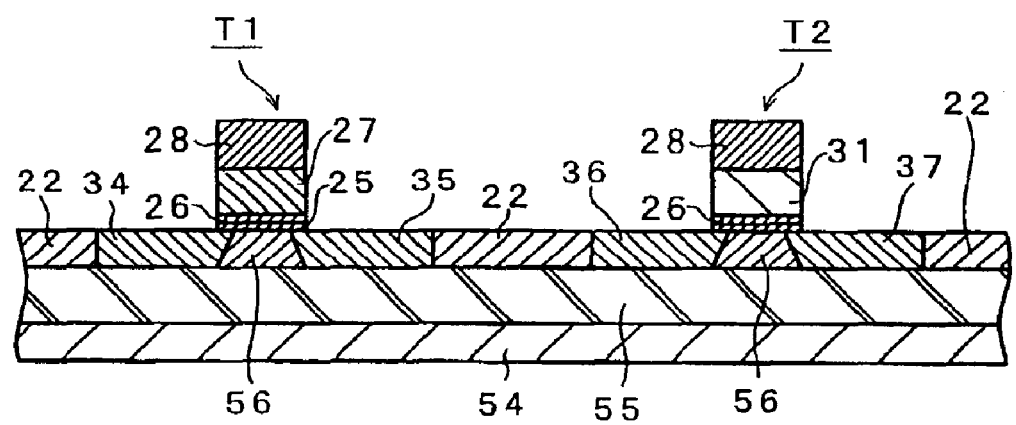
FIG. 22 is a cross-sectional view describing yet another semiconductor integrated circuit device according to the invention.

FIG. 22 is a cross-sectional view of the essential parts 10 of an SOI integrated circuit device in yet another embodiment. In the first transistor on the left-hand side, the P type polysilicon layer effectively not containing Ge and having a thickness of approximately 2 nm is interposed between the gate insulating film 26 and the P type Si—Ge mixed crystal 27, containing approximately 55% Ge and having a thickness of approximately 40 nm, and the metal layer 28, e.g., Ti, TiN, WN, TiSi, W, or WSi, is provided on the aforesaid Si—Ge gate electrode 27.

On the other hand, in the second transistor on the right-hand side, the P type polysilicon layer effectively not containing Ge and having a thickness of approximately 2 nm is interposed between the gate insulating film 26 and the P type Si—Ge mixed crystal 31 containing approximately 25% Ge and having a thickness of approximately 40 nm, and the metal layer 28, e.g., Ti, TiN, WN, TiSi, W, or WSi, is provided on the aforesaid Si—Ge gate electrode 31. In this construction, a high-performance integrated circuit device capable of high-speed operation and free of the influence of short channel effects can be provided with high reproducibility.

Figure 23A:
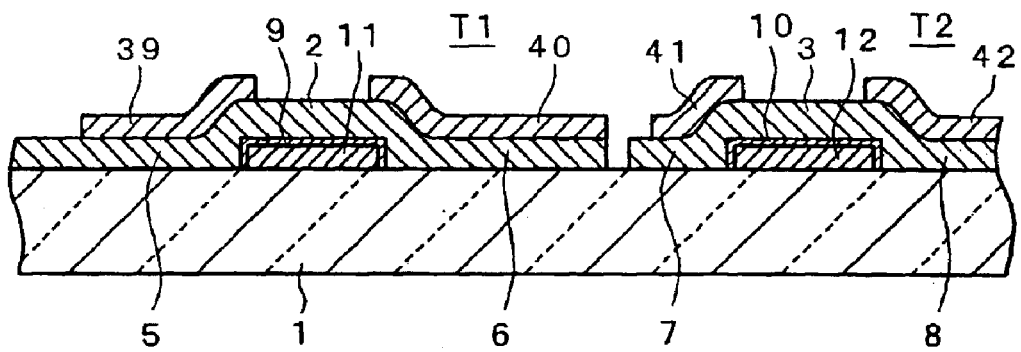
FIG. 23A is a cross-sectional view describing yet another semiconductor integrated circuit device according to the invention.
Figure 23B:
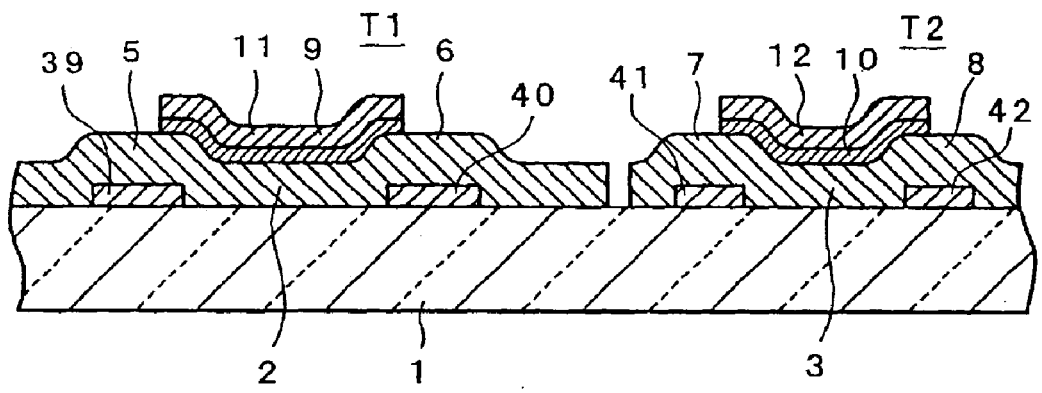
FIG. 23B is a cross-sectional view describing yet another semiconductor integrated circuit device according to the invention.
Figure 23C:
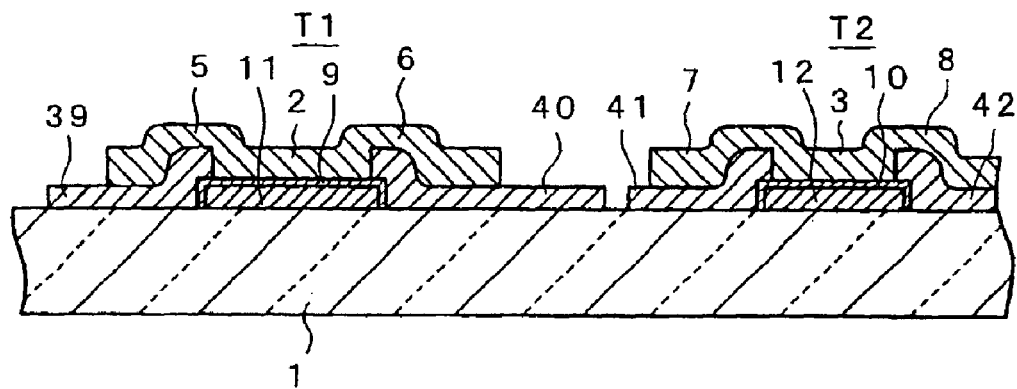
FIG. 23C is a cross-sectional view describing yet another semiconductor integrated circuit device according to the invention.

In the above, a detailed description has been given of a semiconductor element wherein gate, source and drain electrodes are provided on the upper part of a semiconductor layer, but this invention may also be applied to a thin film semiconductor integrated circuit device using semiconductor elements (TFT) of various types, shown in FIGS. 23A, 23B, and 23C. Specifically, the Si—Ge mixed crystal gate electrodes 11 and 12; the gate insulating films 9 and 10 covering the surface of the gate electrodes; the semiconductor layers 2 and 3; the source regions 5 and 7 and drain regions 6 and 8 provided on this semiconductor layer; the source electrodes 39 and 41; and the drain electrodes 40 and 42 respectively having different composition ratios are formed on the upper part of the insulator 1. Also, in these types of devices, the advantage of this invention may be achieved by interposing a very thin Si layer, not shown, between the gate electrodes and gate insulating films, and/or by coating the aforesaid metal on the gate electrode surface opposite to the gate insulating film. In particular, in the types shown in FIGS. 23A and 23C, a semiconductor layer which functions like the active region of an element can be formed after forming the gate 26 electrodes and gate insulating films, so heating from the amorphous state to the crystallization of the semiconductor layer is easily controlled, and the scattering of Vth characteristics of the integrated circuit device can be reduced.

A gate electrode having different work functions can be formed with good compatibility with prior art MOSLSI, and therefore, a field effect transistor having plural threshold values can be integrated with one chip, regardless of the impurity concentration of the substrate.

In the aforesaid embodiments of the invention, the description focused mainly on a circuit device wherein plural transistors of different Vth were integrated in one semiconductor region, a possible application being a thin film IC.

As already described in FIG. 2 to FIG. 4, the Inventor found that the following are preferable forms for the gate insulating type transistor used in its various applications.

(1) An insulating gate type field effect semiconductor device comprising isolated first and second semiconductor regions of a first conducting type; a third semiconductor region of a second conducting type which shares a main surface with the first and second semiconductor regions and is provided between and in contact with the same; a gate insulating film covering the main surface of the third semiconductor region, and a Si—Ge mixed crystal gate electrode formed on this gate insulating film; and a Si layer thinner than the gate electrode and effectively not containing Ge provided between the gate electrode and the gate insulating film.

(2) An insulating gate type field effect semiconductor device comprising isolated first and second semiconductor regions of a first conducting type; a third semiconductor region of a second conducting type, which shares a main surface with the first and second semiconductor regions and is provided between and in contact with the same; a gate insulating film covering the main surface of the third semiconductor region; a Si—Ge mixed crystal gate electrode formed on this gate insulating film; and a metal layer comprising at least one material chosen from a group of metals comprising Ti, TiN, WN, TiSi, W, and WSi formed on the upper surface of this gate electrode.

(3) An insulating gate type field effect semiconductor device comprising isolated first and second semiconductor regions of a first conducting type; a third semiconductor region of a second conducting type, which shares a main surface with the first and second semiconductor regions and is provided between and in contact with the same; a gate insulating film covering the main surface of the third semiconductor region; a Si—Ge mixed crystal gate electrode formed on this gate insulating film; a Si layer thinner than the gate electrode and effectively not containing Ge provided between the gate electrode and the gate insulating film; and a metal layer comprising at least one material chosen from a group of metals comprising Ti, TiN, WN, TiSi, W, and WSi formed on the upper surface of this gate electrode.

What is claimed is:

1. A method of manufacturing a semiconductor integrated circuit device having a plurality of insulated gate type semiconductor elements comprising the steps of forming a gate insulating film on the surface of a first semiconductor region of a first conductivity type, depositing a first Si—Ge mixed crystal gate electrode layer having a first composition and a second Si—Ge mixed crystal gate electrode layer having a second composition different from said first composition on different surfaces of said gate insulating film, forming a first and a second gate electrodes by respectively patterning said first and second gate electrode layers, and forming a plurality of semiconductor regions of a second conductivity type by introducing the second conductivity type determining impurities into said first semiconductor region not covered by said first and second gate electrodes, wherein Si layers thinner than said first and second Si—Ge mixed crystal gate electrode layers and substantially not containing Ge are respectively interposed between said first and second Si—Ge mixed crystal gate electrode layers and said gate insulating film, and wherein thicknesses of the Si layers are $\frac{1}{10}$th or less than thicknesses of the first and second Si—Ge mixed crystal gate electrode layers.

2. A method of manufacturing a semiconductor integrated circuit device according to claim 1 wherein said first and second Si—Ge mixed crystal gate electrode layers are deposited by Chemical Vapor Deposition using a gas containing a Si compound and a Ge compound.

3. A method of manufacturing a semiconductor integrated circuit device according to claim 1 wherein said first and second Si—Ge mixed crystal gate electrode layers are deposited by Chemical Vapor Deposition using a gas containing a Si compound and a Ge compound.

* * * * *